United States Patent [19]

Okishi et al.

[11] 4,294,905

[45] Oct. 13, 1981

[54] LIGHT-SENSITIVE LITHOGRAPHIC PRINTING PLATE AND COMPOSITIONS THEREFORE WITH MULTIPLE RESINS

[75] Inventors: Yoshio Okishi; Akinobu Koike; Shizuo Miyano, all of Shizuoka, Japan

[73] Assignee: Fuji Photo Film Co., Ltd., Minami-ashigara, Japan

[21] Appl. No.: 49,246

[22] Filed: Jun. 18, 1979

[30] Foreign Application Priority Data

Jun. 16, 1978 [JP] Japan .................................. 53-72787

[51] Int. Cl.³ ....................... G03C 1/60; G03C 1/52; G03F 7/08
[52] U.S. Cl. .................................... 430/175; 430/176; 430/192; 430/285; 430/286; 430/287; 430/910; 430/157; 430/165
[58] Field of Search ............... 430/175, 176, 192, 274, 430/302, 289

[56] References Cited

U.S. PATENT DOCUMENTS

| 2,980,534 | 4/1961 | Printy et al. | 430/274 |
| 2,990,281 | 6/1961 | Printy et al. | 430/274 |
| 3,316,092 | 4/1967 | Klimkowski et al. | 430/176 |
| 3,544,317 | 12/1970 | Yonezawa | 430/175 |
| 3,759,711 | 9/1973 | Rauner et al. | 430/192 |
| 3,802,885 | 4/1974 | Lawson et al. | 430/192 |
| 4,123,276 | 10/1978 | Kita et al. | 430/176 |
| 4,186,069 | 1/1980 | Muzyczko et al. | 430/175 |

Primary Examiner—Charles L. Bowers, Jr.
Attorney, Agent, or Firm—Sughrue, Mion, Zinn, Macpeak and Seas

[57] ABSTRACT

A light-sensitive lithographic printing plate comprising a support having on at least one surface thereof a light-sensitive layer, said light-sensitive layer exhibiting a higher oleophilicity (high affinity to grease) at the outermost surface thereof than in the balance of the light-sensitive layer. This light-sensitive lithographic printing plate is capable of beginning the printing operation with a relatively small number of spoilages and exhibits not only excellent press life but also high developability and excellent storage stability.

27 Claims, 2 Drawing Figures

LIGHT-SENSITIVE LITHOGRAPHIC PRINTING PLATE AND COMPOSITIONS THEREFORE WITH MULTIPLE RESINS

BACKGROUND OF THE INVENTION

1. Field of the Invention

The present invention relates to a light-sensitive lithographic printing plate (or so-called presensitized plate) and more particularly to an improved light-sensitive lithographic printing plate in which a light-sensitive layer has a particular constitution.

2. Description of the Prior Art

The light-sensitive materials previously used in presensitized printing plates are, for the most part, diazonium compounds and of such compounds, the most frequently used are diazo resins such as the formaldehyde condensates of p-diazodiphenylamines. On the occasion that such a diazo resin is coated on an appropriate support such as a sheet of paper, a plastic film, a metal plate or the like and the resulting coating is exposed to actinic radiation through a negative transparency, the diazo resin present undergoes photodecomposition in the exposed areas and is converted into water-insoluble substances (such portions are hereinafter referred to as the image areas). On the other hand, the unexposed areas are subsequently washed out with water and thereby the surface of the support is exposed in areas corresponding to the unexposed areas (such portions are hereinafter referred to as non-image areas). When the support used has been subjected to a preliminary treatment so as to render the surface thereof hydrophilic, the hydrophilic surface is exposed in the unexposed areas through development. Accordingly, this area accepts water and repels greasy ink on an offset printing machine. On the other hand, the photodecomposition products of a diazo resin display an oleophilic property and repel water and accept greasy ink thereon. Light-sensitive printing plates of this kind are the so-called negative working light-sensitive printing plates.

Compositions of the light-sensitive layers suitable for the light-sensitive printing plates of the above-described kind can be grouped into two classes: One class includes compositions consisting of diazo resins alone, namely compositions free from binders, as described, for example, in U.S. Pat. No. 2,714,066; and the other class includes compositions consisting of combinations of diazo resins and binders, as described, for example, in U.S. Pat. No. 2,826,501 and British Pat. No. 1,074,392. In the former case, the thickness of the light-sensitive layer is on the order of 20 to 100 mg/m² (converted to a basis of coated weight) due to the absence of a binder. The light-sensitive layer can only provide an image possessing low abrasion resistance and short press life as it stands. Therefore, it is necessary to strengthen the image areas. In order to afford printing plates that can resist various kinds of mechanical forces such as friction, peeling and like forces, which occur during the printing process certain resins are selectively fixed on the image areas using lacquers in the form of emulsions simultaneously with or after the development-processing. Lacquers employed for such purpose must have excellent abrasion resistance, be able to adhere to the image part and not likely to cause catch up, scum and the like. U.S. Pat. No. 2,754,279 discloses an improved lacquer composition. However, since plate-making operators coat lacquers on the lithographic printing plates and further many of the abilities of the printing plates obtained depend on whether lacquers are coated thereon skillfully or unskillfully, great skill is required. With the intention of overcoming such disadvantages, light-sensitive lithographic printing plates incorporating in the light-sensitive layers together with diazo resins, resins excellent in abrasion resistance corresponding to the above-described lacquers, and in which the light-sensitive layers are adjusted so as to have the requisite thickness (about 0.5 to 5 g/m²) have been proposed as disclosed in each of U.S. Pat. No. 2,826,501 and British Pat. No. 1,074,392. When the light-sensitive lithographic printing plate of this kind is exposed to light through an image-bearing transparency and subsequently development-processed using a certain developing solution, the unexposed areas of the light-sensitive layer can be removed from the base and the exposed areas of the light-sensitive layer are left on the base, because the exposed areas possess lower solubility in the developing solution or lower facility upon swelling in the developing solution than the unexposed areas do. Accordingly, the thus-obtained lithographic printing plates exhibit excellent printabilities equivalent or superior to those attained in the case that the above-described lacquers are coated upon the image areas after development.

However, in the case of the incorporation of resins into the light-sensitive layers the compatibilities of the resins used with the diazo resins and the selection of common solvents are important, and the resins contained as binders in the light-sensitive layers must have such a property that the exposed areas of the light-sensitive layer containing the resin functioning as a binder becomes, on the whole, insoluble in the developing solution through photodecomposition of the light-sensitive substance, or there is a clear difference in solubility or in the degree of swelling between the exposed and the unexposed areas, namely excellent hardening property. Further the coexistence of the resin with the light-sensitive diazo resin cannot cause deterioration in the storage stability of the light-sensitive layer. That is, properties of the light-sensitive layer such as sensitivity, developability, etc., are maintained at fresh levels upon storage. It has been known that certain water-soluble colloids can produce resists of very high quality when employed as binders for diazo resins but they deteriorate in a few days due to a dark reaction and lose their sensitivities to light.

As resins possessing many of the properties required for the above-described purposes to a satisfactory extent, shellac as described in British Pat. No. 1,350,521; homopolymers of hydroxyalkylacrylates or hydroxyalkylmethacrylates or copolymers prepared from either of the above-described monomers and one or more of a copolymerizable monomer, as described in British Pat. Nos. 1,460,978; 1,475,599 and 1,505,739; and so on have been known.

However, even in the lithographic printing plates made using light-sensitive lithographic printing plates having light-sensitive layers comprising such binders and diazo resins, the sensitivity to grease (namely the ability to accept greasy ink employed for lithographic printing) in the image areas is low. Therefore, when prints are produced in large numbers repeatedly using the same printing plate, the first sheets of prints have low image densities and only upon subsequent printing are prints of desired image densities obtained. Accordingly, the first sheets of prints having low image densities cannot but be discarded as spoilages. The solution of this problem has been sought earnestly by one skilled in the printing art for a long time.

Now, as a technical approach for producing light-sensitive lithographic printing plates which can afford lithographic printing plates having image areas possessing high oleophilic property (i.e., affinity to grease), a method in which a small amount of binder having a strong oleophilic character is added to the light-sensitive layer has been adopted. For instance, U.S. Pat. No. 4,123,297 corresponding to Japanese Patent Application (OPI) No. 125806/75 (the term "OPI" as used herein refers to a "published unexamined Japanese patent application") discloses a process for imparting a high affinity to grease to the light-sensitive layer in which a strongly oleophilic novolak type t-butylphenol-formaldehyde resin is homogeneously incorporated in small amounts into the light-sensitive layer comprising an o-quinonediazide and a novolak type cresol-formaldehyde resin. However, there are various restrictions on the material such as the strongly oleophilic binder employed to increase the oleophilic property must possess good compatibility with the binder employed for improving the press life and must not reduce developability. Under these circumstances, such an approach can be applied only with an extremely limited range of binders. In practice, although the above-described approach has been applied to the negative type light-sensitive lithographic printing plates disclosed in British Pat. No. 1,475,599 for the purpose of producing lithographic printing plates more excellent in the affinity to grease, satisfactory results could not be obtained.

SUMMARY OF THE INVENTION

Therefore, an object of the present invention is to provide a light-sensitive lithographic printing plate which produces only a few spoilages at the beginning of printing.

Another object of the present invention is to provide a light-sensitive lithographic printing plate in which the image areas have a high oleophilic property.

A further object of the present invention is to provide a light-sensitive lithographic printing plate which has high oleophilic property in the image areas, excellent printing impression or press life and exhibits excellent developability and storage stability.

Still another object of the present invention is to provide a light-sensitive lithographic printing plate in which the high oleophilic property in the image areas is attained using a technical means applicable to or suitable for a wide variety of presensitized printing plates.

The above-described objects are attained by producing a light-sensitive lithographic printing plate comprising a support and a light-sensitive layer provided on at least one side of the support so that the surface of the light-sensitive layer exhibits the higher affinity to grease than in the balance of the light-sensitive layer.

The above-described light-sensitive layer embodied in the present invention was discovered through investigations which at least in part contradict the fundamental thinking that the light-sensitive substance and binder employed in the light-sensitive layer and particularly the binders employed for their respective purposes must be compatible with one another, and therefore the success of the present invention is particularly surprising.

DETAILED DESCRIPTION OF THE INVENTION

Figure 1:
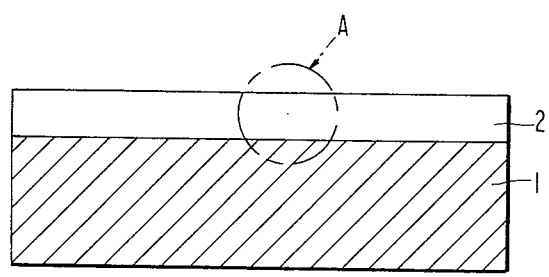
FIG. 1 is a cross section of the light-sensitive lithographic printing plate of the present invention comprising a support 1 and a light-sensitive layer 2.

The light-sensitive lithographic printing plate of the present invention has a structure comprising basically a support 1 and a light-sensitive layer 2 provided on the support.

As the above-described support, various materials conventionally used as supports for lithographic printing plates and particularly plates possessing high dimensional stability are preferred. Specific examples of such materials include metal plates of aluminum, aluminum alloys, zinc, iron, copper, etc.; plastic films of cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal, etc.; and sheets of paper or plastic films on which metals as described above are laminated or deposited.

Of these materials, particularly preferable are metal plates and metal laminated or deposited plastic films, the most favorable of which is an aluminum plate.

These base materials are optionally subjected to surface treatments. The surface treatments are performed for various purposes, for example, to improve wettability of the support surface for the fountain solution used at the time of printing, improve adhesiveness between the support and a light-sensitive layer provided thereon, prevent harmful reactions from occurring between the support and the light-sensitive layer provided thereon, and so on. For instance, plastic supports are generally subjected to some treatment to render their surfaces hydrophilic. Specific examples of such a preliminary treatment include the so-called surface treatments, such as a chemical treatment, a discharge treatment, a flame treatment, an ultraviolet radiation treatment, a high frequency treatment, a glow discharge treatment, an activated plasma jet flame treatment, a laser treatment and so on as described in U.S. Pat. Nos. 2,764,520; 3,497,407, 3,145,242, 3,376,208, 3,072,483, 3,475,193 and 3,360,448, British Pat. No. 788,365, etc., and the coating of a subbing layer on the plastic support having once received one of the surface treatments described above.

Various techniques for coating the subbing layer have been devised. For example, there are a double layer coating technique in which a hydrophobic resin layer possessing high adhesiveness to plastic supports and good solubility is coated as the first subbing layer and thereon a hydrophilic resin layer is additionally coated as the second subbing layer; and a single layer coating technique in which a resin containing both hydrophobic and hydrophilic groups in one polymer molecule is coated in a layer on the support.

On the other hand, in the case of supports having the surfaces made of metals, particularly aluminum, surface treatments such as a graining treatment, a dipping treatment in an aqueous solution of sodium silicate, potassium fluorozirconate, phosphates or the like salt, an anodic oxidation treatment, etc., are preferred. In addition, an aluminum plate which has received a graining treatment and a subsequent dipping treatment in the aqueous solution of sodium silicate as described in U.S.

Pat. No. 2,714,066; or an aluminum plate which has received an anodic oxidation treatment and a subsequent dipping treatment in an aqueous solution of silicate of an alkali metal (as described in U.S. Pat. No. 3,181,461) are also well-suited to be employed as a support. The above-described anodic oxidation treatment can be performed by using, as an anode, an aluminum plate and, as an electrolytic solution, an aqueous solution of an inorganic acid such as a phosphoric acid, a chromic acid, a sulfuric acid, a boric acid, etc.; an organic acid such as oxalic acid, sulfamic acid, etc.; or the salt thereof; or a non-aqueous solution alone or a combination of two or more different non-aqueous solutions, particularly an aqueous solution of phosphoric acid, sulfuric acid or the mixture thereof, and by passing electric current therethrough.

Moreover, silicate electrodeposition as described in U.S. Pat. No. 3,658,662 is also effective.

Furthermore, British Pat. No. 1,208,224 discloses a treatment that an aluminum plate is electrolyzed by alternating electric current in a hydrochloric acid-containing electrolytic solution, followed by anodic oxidation in a sulfuric acid-containing electrolytic solution.

In addition, it is preferable from the standpoint of the prevention of scum from occurring during printing to provide a subbing layer comprising a cellulosic resin containing water-soluble salts of metals such as zinc, etc., on the aluminum plate oxidized anodically in the process as described in U.S. Pat. No. 3,860,426.

Next, the light-sensitive layer which is characteristic of the present invention is illustrated below using a light-sensitive layer containing a diazo resin as a light-sensitive component as an example.

In general, the light-sensitive layer of a negative working light-sensitive lithographic printing plate containing a diazo resin also contains a binder in order to increase the press life of the lithographic printing plate obtained as described above. The light-sensitive layer of the lithographic printing plate of the present invention additionally contains a polymer which has in its side chains groups capable of improving the compatibility with the above-described binder and a main chain which has poor compatibility with the above-described binder. Preferable examples of such a light-sensitive lithographic printing plate include plates which comprise supports having thereon light-sensitive layers containing (a) polymers containing as repeating units both a moiety represented by the formula (I) and a moiety represented by the formula (II) and having an acid value of about 10 to 100:

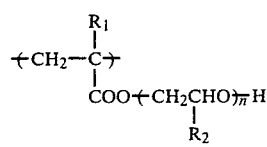

(I)

wherein $R_1$ represents a hydrogen atom or a methyl group, $R_2$ represents a hydrogen atom, a methyl group, an ethyl group or a chloromethyl group, and n represents an integer of 1 to 10;

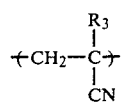

(II)

wherein $R_3$ represents a hydrogen atom or a methyl group; (b) polymers containing as repeating units both a moiety represented by the formula (III) and a moiety represented by the formula (IV):

(III)

wherein $R_4$ represents a hydrogen atom, a methyl group, an ethyl group, a methoxy group, an ethoxy group or an aryl group;

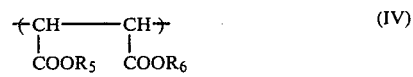

(IV)

wherein $R_5$ represents a hydrogen atom, a methyl group or an ethyl group, and $R_6$ represents an alkyl group or an aryl group; and (c) a diazo compound.

The polymers corresponding to the component (a) described above increase press life and, on the other hand, the polymers corresponding to the component (b) described above increase the oleophilic property of the lithographic printing plates.

Specific examples of aryl groups represented by $R_4$ in the formula (III) described above include monocyclic aryl groups such as a phenyl group, a chlorophenyl group, a xylyl group, a cumenyl group and the like; and dicyclic aryl groups such as a naphthyl group and the like. Of these groups, a phenyl group is particularly preferable.

The alkyl groups represented by $R_6$ in the formula (IV) contain 2 to 20 carbon atoms and more preferably 5 to 10 carbon atoms and are straight chain, branched chain or cyclic. Specific examples of such alkyl groups include an n-propyl group, an isopropyl group, a butyl group, a tert-butyl group, an n-hexyl group, a 2-ethylhexyl group, a 1,3-dimethylbutyl group, an n-octyl group, an n-tridecanyl group and the like. Of these groups, more preferable are an n-hexyl group, a 2-ethylhexyl group, a 1,3-dimethylbutyl group and an n-octyl group.

Specific examples of aryl groups represented by $R_6$ include monocyclic aryl groups such as a phenyl group, a chlorophenyl group and the like, and dicyclic aryl groups such as a naphthyl group and the like.

The polymers of the above-described component (a) can be obtained by copolymerizing three, four or more monomers, for example, a monomer represented by the following formula (V):

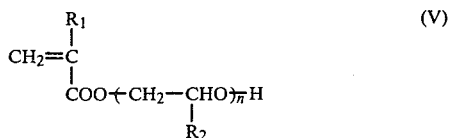

(V)

wherein $R_1$, $R_2$ and n each has the same meaning as in the formula (I); acrylonitrile or methacrylonitrile; an $\alpha,\beta$-unsaturated carboxylic acid; and optionally addition polymerizable unsaturated monomer other than the above-described compounds.

The acid value of the polymers of component (a) is attained by adjusting the amount of $\alpha,\beta$-unsaturated carboxylic acid units in the copolymer. Alternatively the acid value can be attained by reacting a cyclic anhydride (half-esterification) to introduce carboxyl groups into the polymer. Thus, the polymers of the above-described component (a) can also be obtained by half-esterifying the binary, ternary or polymonomer copolymers, each containing the compound represented by the formula (V), acrylonitrile or methacrylonitrile, and optionally other addition polymerizable unsaturated compounds, with cyclic acid anhydrides.

Specific examples of the above-described α,β-unsaturated carboxylic acids include acrylic acid, methacrylic acid, α-ethylacrylic acid, maleic anhydride, methylmaleic anhydride, phenylmaleic anhydride, crotonic acid, itaconic acid, vinylbenzoic acid, sorbic acid, cinnamic acid, etc.

The above-described other addition polymerizable unsaturated compounds are selected from compounds having one addition polymerizable unsaturated bond in each molecule, and include, for example, acrylates, methacrylates, acrylamides, methacrylamides, allyl compounds, vinyl ethers, vinyl esters, styrenes, crotonates, etc. Specific examples of such compounds include acrylates such as alkylacrylates (e.g., methylacrylate, ethylacrylate, propylacrylate, butylacrylate, amylacrylate, ethylhexylacrylate, octylacrylate, t-octylacrylate, chloroethylacrylate, 2,2-dimethylhydroxypropylacrylate, 5-hydroxypentylacrylate, trimethylolpropane monoacrylate, pentaerythritol monoacrylate, glycidylacrylate, benzylacrylate, methoxybenzylacrylate, furfurylacrylate, tetrahydrofurfurylacrylate, etc.) and arylacrylates (e.g., phenylacrylate, etc.); methacrylates such as alkylmethacrylates (e.g., methylmethacrylate, ethylmethacrylate, propylmethacrylate, isopropylmethacrylate, amylmethacrylate, hexylmethacrylate, cyclohexylmethacrylate, benzylmethacrylate, chlorobenzylmethacrylate, octylmethacrylate, 4-hydroxybutylmethacrylate, 5-hydroxypentylmethacrylate, 2,2-dimethyl-3-hydroxypropylmethacrylate, trimethylolpropane monomethacrylate, pentaerythritol monomethacrylate, glycidylmethacrylate, furfurylmethacrylate, tetrahydrofurfurylmethacrylate, etc.) and arylmethacrylates (e.g., phenylmethacrylate, cresylmethacrylate, naphthylmethacrylate, etc.); acrylamides such as acrylamide, N-alkylacrylamides (the alkyl moieties of which are, for example, methyl, ethyl, propyl, butyl, t-butyl, heptyl, octyl, cyclohexyl, hydroxyethyl, benzyl, etc.), N-arylacrylamides (the aryl moieties of which are, for example, phenyl, tollyl, nitrophenyl, naphthyl, hydroxyphenyl, etc.), N,N-dialkylacrylamides (the alkyl moieties of which are, for example, methyl, ethyl, butyl, isobutyl, ethylhexyl, cyclohexyl, etc.), N,N-diarylacrylamides (the aryl moieties of which are, for example, phenyl, etc.) N-methyl-N-phenylacrylamide, N-hydroxyethyl-N-methylacrylamide, N-2-acetoamidoethyl-N-acetylacrylamide, etc.; methacrylamides such as methacrylamide, N-alkylmethacrylamides (the alkyl moieties of which are, for example, methyl, ethyl, t-butyl, ethylhexyl, hydroxyethyl, cyclohexyl, etc.), N-arylmethacrylamides (the aryl moieties of which are, for example, phenyl, etc.), N,N-dialkylmethacrylamides (the alkyl moieties of which are, for example, ethyl, propyl, butyl, etc.), N,N-diarylmethacrylamides (the aryl moieties of which are, for example, phenyl, etc.), N-hydroxyethyl-N-methylmethacrylamide, N-methyl-N-phenylmethacrylamide, N-ethyl-N-phenylmethacrylamide, etc.; allyl compounds such as allyl esters (e.g., allyl acetate, allyl caproate, allyl caprylate, allyl laurate, allyl palmitate, allyl stearate, allyl benzoate, allyl acetoacetate, allyl lactate, etc.), allyl oxyethanol, etc.; vinyl ethers such as alkyl vinyl ethers (e.g., hexyl vinyl ether, octyl vinyl ether, decyl vinyl ether, ethylhexyl vinyl ester, methoxyethyl vinyl ether, ethoxyethyl vinyl ether, chloroethyl vinyl ether, 1-methyl-2,2-dimethylpropyl vinyl ether, 2-ethylbutyl ether, hydroxyethyl vinyl ether, diethyleneglycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (e.g., vinyl phenyl ether, vinyl tollyl ether, vinyl chlorophenyl ether, vinyl-2,4-dichlorophenyl ether, vinyl naphthyl ether, vinyl anthranyl ether, etc.), etc.; vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-α-phenylbutyrate, vinyl cyclohexyl carboxylate, vinyl benzoate, vinyl salicylate, vinyl chlorobenzoate, vinyl tetrachlorobenzoate, vinyl naphthoate, etc.; styrenes such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxyethylsytrene, acetoxymethylstyrene, etc.), alkoxystyrenes (e.g., methoxystyrene, 4-methoxy-3-methylstyrene, dimethoxystyrene, etc.), halostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), etc.; crotonic acid esters such as alkyl crotonates (e.g., butyl crotonate, hexyl crotonate, glycerine monocrotonate, etc.), etc.; dialkyl itaconates (e.g., dimethyl itaconate, diethyl itaconate, dibutyl itaconate, etc.); dialkyl esters of maleic acid or fumaric acid (e.g., dimethyl maleate, dibutyl fumarate, etc.), etc. In addition, any other compounds which belong to the category of addition polymerizable unsaturated compounds and that can copolymerize with both the compounds represented by the above-described formula (V) and acrylonitrile or methacrylonitrile may, in general, be employed, provided that they do not contain such functional groups that they may react with the hydroxy group of β-hydroxyethyl(meth)acrylate at room temperature or contain two or more polymerizing vinyl groups in one molecule such that the gel.

Specific examples of cyclic acid anhydrides which are semi-esterified by reacting with the copolymers prepared from the compounds represented by the above-described formula (V), acrylonitrile or methacrylonitrile, and optionally other addition polymerizable unsaturated compounds include phthalic anhydride, tetrahydrophthalic anhydride, hexahydrophthalic anhydride, 3,6-endomethylene-$\Delta^4$-tetrahydrophthalic anhydride, tetrachlorophthalic anhydride, maleic anhydride, chloromaleic anhydride, succinic anhydride, n-dodecylsuccinic anhydride and so on. The copolymers of component (a) are described in greater detail in U.S. Pat. No. 4,123,276 which is incorporated herein by reference.

In one embodiment, from 64 to 10% of the repeating units of said copolymer are addition polymerizable ethylenically unsaturated compound units other than the above units, wherein the unsaturated compound is selected from the group consisting of acrylates, methacrylates, acrylamide, methacrylamide, allyl compounds, vinyl ethers, vinyl esters, styrenes or crotonates and the viscosity of the copolymer is 1,000 to 20,000 cps as determined for a 33% by weight solution of said copolymer in ethylene glycol monomethyl ether at 25° by means of a Brookfield rotational viscosimeter.

The copolymers of component (a) can be easily synthesized by one skilled in the art in accordance with the method described in British Pat. No. 1,505,739. For instance, they can be obtained by polymerizing the compounds represented by the formula (V), acrylonitrile or methacrylonitrile, α,β-unsaturated carboxylic acid and optionally other addition polymerizable unsaturated compounds in suitable solvents using a solution polymerization technique. Specific examples of solvents employed preferably in the solution polymerization reaction include ethylene glycol monomethyl ether, ethylene glycol monobutyl ether, dioxane, an ethanol-water mixed solvent, a methanol-water mixed solvent, methyl ethyl ketone and an ethanol-acetic acid mixed solvent. Specific examples of polymerization initiators favorably employed therein include benzoin ethyl ether, azobisisobutylonitrile, 2,2'-azobis(2,4-dimethylvaleronitrile), 1,1'-azobis(cyclohexane-1-carbonitrile), 2,2'-azobis(4-methoxy-2,4-dimethylvaleronitrile), 2-phenylazo-2,4-dimethyl-4-valeronitrile, 2-cyano-2-propylazoformamide, potassium persulfate, t-butyl peroctoate, benzoyl peroxide, isopropyl percarbonate, 2,4-dichlorobenzoyl peroxide, methyl ethyl ketone peroxide and so on. In addition, it is preferred to carry out the polymerization reaction at a temperature ranging from about 20° C. to about 150° C.

A preferable acid value of the copolymer of the component (a) ranges from about 10 to 100, particularly from about 15 to 40. Acid values below 10 are inappropriate for practical use because only poor development can be attained by using weak alkaline water and on the other hand acid values over 100 are unfit for the purposes of the present invention because the sensitivity to grease (oleophilic character) of the image area decreases. The acid value of the copolymer can be easily controlled by properly choosing the amount of α,β-unsaturated carboxylic acid contained in the copolymer or the degree of semi-esterification of the cyclic acid anhydride.

A preferable content of the structural unit (II) of acrylonitrile or methacrylonitrile in the copolymer of the component (a) ranges from about 5 wt% to 60 wt%, particularly from about 10 wt% to 40 wt%. A preferable content of the structural unit represented by the formula (I) ranges from about 30 wt% to 80 wt%, particularly from about 40 wt% to 60 wt%. Insufficient mechanical strength in the image areas which hinders developability is obtained with contents below 30 wt%. On the other hand, contents over 80 wt% are undesirable because a swelling phenomenon occurs in the image area during development-processing and further the oleophilic property of the image area is reduced to a great extent.

Molecular weights of the copolymers of component (a) ranging from about 5,000 to about 60,000 (measured by a number average method) are suitable for practical use, and the range of about 10,000 to 50,000 is more preferable. The copolymer of the component (a) is contained in the light-sensitive layer of the present invention in a proportion ranging preferably from about 50 wt% to 95 wt%, more particularly from about 60 wt% to 92 wt%.

The copolymer of the component (b) described above can be synthesized by copolymerizing the compound represented by the following formula (VI) and maleic anhydride and then by reacting the moeities originating from maleic anhydride in the resulting copolymer with an alcohol having the formula of $R_6OH$ wherein $R_6$ has the same definition as in the formula (IV) and optionally by further reacting the reaction product with an alcohol having the formula of $R'_5OH$ wherein $R'_5$ represents a methyl or an ethyl group:

wherein $R_4$ has the same meaning as $R_4$ in the formula (III).

Also, the copolymer of the component (b) can be obtained by copolymerizing the compound represented by the above-described formula (VI) and the compound represented by the following formula (VII):

wherein $R_5$ and $R_6$ have the same definition as $R_5$ and $R_6$, respectively, in the formula (IV).

The copolymers of the component (b) can be easily synthesized by one skilled in the art according to methods described in, for example, U.S. Pat. Nos. 3,388,106 and 3,418,292.

In the copolymers of the component (b), the third structural unit, other than the structural units represented by the formulae (III) and (IV), respectively, can be present. Monomers employable as such a copolymerizing component can be selected from the other addition polymerizable unsaturated compounds set forth in the description of the copolymers of the component (a).

The content of the structural unit represented by the formula (III) in the copolymer of the component (b) ranges from about 20 wt% to about 80 wt%, preferably from 40 wt% to 70 wt%. On the other hand, the content of the structural unit represented by the formula (IV) in the copolymer of the component (b) ranges from about 20 wt% to about 80 wt%, preferably from 40 wt% to 70 wt%.

The number average molecular weight of the copolymer of the component (b) is, in general, about 500 to 50,000, and more preferably about 750 to 30,000 and particularly from 800 to 10,000.

The copolymer of the component (b) is contained in the light-sensitive layer in a proportion of about 0.05 wt% to about 20 wt%, more preferably 0.1 wt% to 5 wt%.

The diazo compounds of component (c) include U.V.-sensitive diazonium salts and diazo resins which include as a representative example the condensation product of p-diazodiphenylamine and formaldehyde. Of these compounds, those which are insoluble to water and soluble in commonly used organic solvents are preferable.

Moreover, diazo compounds which possess good compatibility with the above-described copolymer of the component (a) to be employed in the present invention are preferable. Specific examples of particularly preferable diazo compounds include compounds containing two or more diazo groups in one molecule, such as the salts of the condensate of p-diazodiphenylamine and formaldehyde or acetoaldehyde. Specific examples of acids preferably employed for forming salts with the above-described condensates include phenol, fluorocapric acid, sulfonic acids such as triisopropylnaphthalene sulfonic acid, 4,4-bisphenyldisulfonic acid, 5-nitro-ortho-toluenesulfonic acid, 5-sulfosalycilic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzenesulfonic acid, paratoluenesulfonic acid, etc., etc. Examples of other desirable diazo compounds include the condensate of 2,5-diemthoxy-4-p-tolylmercaptobenzenediazonium and formaldehyde and the salts thereof (with the above-described acids), the condensate of 2,5-dimethoxy-4-morpholinobenzenediazonium and formaldehyde or acetoaldehyde and the salts thereof (in which the above-described acids are employed for salt-formation) and compounds represented by the following formula (VIII) as described in Japanese Patent Application (OPI) No. 33907/73:

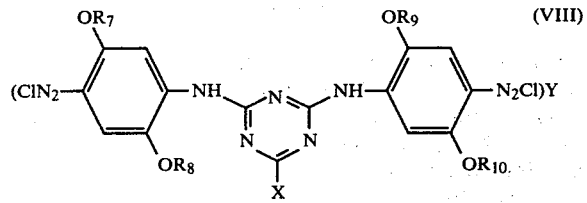

wherein $R_7$, $R_8$, $R_9$ and $R_{10}$ each represents an alkyl group containing 1 to 4 carbon atoms such as a methyl group, an ethyl group, a propyl group, a butyl group, etc.; X represents a substituted amino group, with examples including hydroxylakylamino groups such as an N-($\beta$-hydroxyethyl)amino group, an N,N-di($\beta$-hydroxyethyl)amino group, etc.; and Y represents an acid anion as described above. Specific examples of such compounds include 2,6-dis(4-diazo-2,5-dimethoxyphenylamino)-4-N,N-di($\beta$-hydroxyethyl)amino-1,3,5-triazine 2-methoxy-4-hydroxy-5-benzoylbenzene sulfonate, 2,6-bis(4-diazo-2,5-dimethoxyphenylamino)-4-N-($\beta$-hydroxyethyl)amino-1,2,3,5-triazine 2-methoxy-4-hydroxy-5-benzoylbenzene sulfonate, 2,6-bis(4-diazo-2,5-diethoxyphenylamino)-4-N-($\beta$-hydroxyethyl)amino-1,3,5-triazine 2-methoxy-4-hydroxy-5-benzoylbenzene sulfonate and so on.

In addition, other useful diazo compounds include compounds as described in U.S. Pat. No. 2,649,373.

The most suitable diazo compound is the 2-methoxy-4-hydroxy-5-benzoylbenzene sulfonic acid salt of the condensate of p-diazodiphenylamine and formaldehyde.

An appropriate content of the diazo compound in the light-sensitive layer ranges from about 5 wt% to 50 wt%. Although the sensitivity, of course, increases with an increase in the content of the diazo compound, the storage stability is reduced to a greater extent. Therefore, the optimum range of the content of the diazo compound is about 8 to 20 wt%.

The light-sensitive layer is formed by dissolving the above-described components (a), (b) and (c) in an appropriate solvent, coating the resulting solution on the support as described above and then drying it. Suitable solvents are those which can dissolve each of components (a), (b) and (c), and examples of them include ethylene glycol monoalkyl ethers such as ethylene glycol monomethyl ether, ethylene glycol monoethyl ether, ethylene glycol monobutyl ether, etc.; alcohols such as methanol, ethanol, n-propanol, etc.; halogenated hydrocarbons such as ethylene dichloride, trichloroethylene, etc.; ketones such as methyl ethyl ketone, etc.; and the mixtures thereof.

The light-sensitive layer is, in general, coated at the coverage of about 0.1 to about 7 g/m², and preferably 0.5 to 4 g/m².

After coating, the light-sensitive layer is dried at a temperature ranging from about 40° C. to about 150° C., preferably from 60° C. to 130° C., for about 30 seconds to 3 minutes. The higher the drying temperature, the shorter the drying time and the lower the drying temperature, the longer the drying time.

Figure 2:
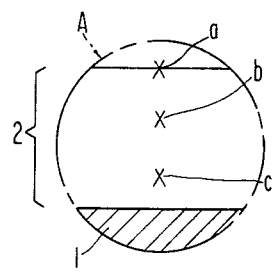
FIG. 2 is a blowup of the circle A in FIG. 1.

In the thus-obtained light-sensitive layer which contains the above-described components (a), (b) and (c), it turns out that each component does not exist in a homogeneously distributed state over all the layer, but the copolymer of the component (b) selectively exists at the surface (the side furthest from the support) of the light-sensitive layer or in the vicinity thereof and the —COOR$_6$ groups, which are present in the side chains of the copolymer of the component (b), face the outside of the light-sensitive layer (the side opposite the support). Due to the partiality of the —COOR$_6$ groups for the surface of the light-sensitive layer, the surface of the light-sensitive layer tends to have an especially high oleophilic character. Namely, illustrating such a feature with FIG. 2, in the light-sensitive layer 1, the the surface a exhibits higher oleophilic property than the parts b and c which are located more interiorly. Therefore, the light-sensitive lithographic printing plates of the present invention can be described as "a light-sensitive lithographic printing plate wherein the surface of the light-sensitive layer provided on at least one side of the support exhibits a higher oleophilic property than the alance of the light-sensitive layer".

Whether the light-sensitive layer has a higher oleophilic character at the surface thereof than in the interior thereof can be ascertained with ease by carrying out the following experiment. Namely, a light-sensitive lithographic printing plate having a support provided thereon with a light-sensitive layer to be examined is exposed to light through an image-bearing transparency and then development-processed. First the contact angle of water with the image area of the thus-obtained lithographic printing plate (which corresponds to exposed areas upon imagewise exposure in case of a negative type light-sensitive lithographic printing plate, while to unexposed areas upon imagewise exposure in case of a positive type light-sensitive lithographic printing plate) is measured prior to printing. Then, the contact angle of water with the iamge area is measured at suitable intervals during printing, for example, every 5,000 sheets using the same lithographic printing plate.

As a result of the investigation of a negative working light-sensitive lithographic printing plate provided with the light-sensitive layer comprising the above-described components (a), (b) and (c) using the above-described experimental method, the contact angle of water with the image area measured prior to printing treatment was 130° to 150° while those measured after 5,000, 10,000 and 30,000 copies were 110° to 140°, 110° to 95°, and 100° to 95°, respectively.

The reason the light-sensitive layer has the character as described above appears consistent with the phenomenon that as the content of the solvent which is used upon the coating of the light-sensitive layer decreases with evaporation during a drying process, phase separation occurs in the interior of the light-sensitive layer due to the poor compatibility of component (a) with component (b) resulting in the accumulation of component (b) at the surface of the light-sensitive layer.

In addition, upon the phase separation, —COOR$_6$ groups attached to the side chains of the copolymer of the component (b) are believed to face the outside of the light-sensitive layer (the side opposite the support). Such an orientation of —COOR$_6$ groups appears to be one of the reasons for the high oleophilic character possessed by the surface of the light-sensitive layer. The theory that component (b) orients itself in this manner is supported by the experimental facts that light-sensitive lithographic printing plates prepared with a light-sensitive layer containing components (a) and (c), the light-sensitive lithographic printing plates prepared with a light-sensitive layer containing components (b) and (c) could not produce image areas exhibiting oleophilic character as high as the image areas formed with a lithographic printing plate prepared with a light-sensitive layer containing components (a), (b) and (c).

To the light-sensitive layer containing the components (a), (b) and (c) can be optionally added various additives such as dyes, pigments, stabilizers, plasticizers, bulking agents and so on for the purpose of improvements upon various abilities. As dyes employed for bringing about a visible contrast between the image area and the support having received a development-processing, those which reduce the color in the image area through development or react with diazo compounds are inadequate. Specific examples of suitable dyes include oil-soluble dyes such as Oil Blue #603 (a product of Orient Chemical Industrial Co., Ltd.), Aizen Spiron Blue GNH and Aizen Spiron Red 2BH (products of Hodogaya Chemical Co., Ltd.), Zapon Fast Fairy Red B (a product of Badische Aniline & Soda Fabrik A.G.), etc. These dyes may be added in amounts sufficient to bring about a clear contrast between the color of the support surface and the color of the image area, and such amounts are, in general, within the limits of about 7% to the total weight of light-sensitive composition.

When the light-sensitive lithographic printing plate provided with the light-sensitive layer comprising the above-described components (a), (b) and (c) is exposed to actinic radiation through a negative transparency, the properties of the exposed areas change and specifically a difference in the degree of swelling between the exposed areas and the unexposed areas results from development processing. Development is carried out by allowing a developing solution comprising weak alkaline water to come into contact with the optically exposed light-sensitive layer. A preferable developing solution contains a water solution of an alkali agent (e.g., sodium silicate, potassium silicate, potassium hydroxide, sodium hydroxide, lithium hydroxide, sodium tertiary phosphate, sodium secondary phosphate, sodium metasilicate, sodium hydrogencarbonate and other inorganic alkalis; ammonia water; and organic amine compounds such as monoethanol amine, diethanol amine, triethanol amine and the like) and further contains preferably an anionic surface active agent and an alcohol. Specific examples of anionic surface active agents include fatty acid salts such as potassium rhodinate, potassium oleate, sodium stearate, etc.; sodium alkylaryl sulfonates (e.g., sodium isopropylnaphthalene sulfonate, etc.); the salts of sulfates of aliphatic and aromatic alcohols (e.g., sodium salt of lauryl alcohol sulfate, ammonium salt of lauryl alcohol sulfate, sodium salt of oleyl alcohol sulfate, sodium salt of octyl alcohol sulfate, sodium salt of xylenol sulfate, etc.); sodium alkyl sulfonates; monosodium salt of N,N-dihydroxyethylglycine; sodium alkylpolyoxyethylene sulfates; sodium dialkylsulfosuccinates; etc. A preferable concentration of such an anionic surface active agent as described above ranges from 0.5 wt% to 10 wt% on the basis of the total weight of developers used. On the other hand, specific examples of preferable alcohols include benzyl alcohol, diacetone alcohol, 2-methoxyethanol, 2-ethoxyethanol, 2-butoxyethanol, isopropyl alcohol and so on. A preferable concentration of such an alcohol as described above ranges from 0.1 wt% to 10 wt%, particularly from 0.5 wt% to 5 wt%, on the basis of the total weight of developers used. And a concentration of an alkali agent depends upon whether the alkali agent to be employed is strong or weak in its alkalinity. However, the range of 0.05 wt% to 5 wt% on the basis of the total weight of developers used is, in general, proper as to an alkali agent. Furthermore, the addition of sodium nitrate or the like in a concentration ranging from 0.5% to 10% to the whole weight of the developing solution is desirable because it can prevent the blanket of a printing machine from being contaminated at the time of printing. Of the above-described alkali agents, the most excellent one is sodium silicate, because it possesses additionally such a function as to depress the contamination of the blanket of a printing machine which arises in the course of printing. In addition, additions of sulfites such as sodium sulfite, potassium sulfite, lithium sulfite, ammonium sulfite, magnesium sulfite and the like are effective for such a purpose.

The light-sensitive lithographic printing plate provided with the light-sensitive layer comprising the above-described components (a), (b) and (c) can be rapidly developed with an aqueous solution of a weak alkali and the development-processing can be easily achieved therein because the range of the optimum developing condition (so-called developing latitude) is wide.

So far, the present invention has been illustrated in detail using the light-sensitive lithographic printing plate having the light-sensitive layer comprising the above-described components (a), (b) and (c). However, the principles of the present invention can be also applied to other light-sensitive lithographic printing plates having light-sensitive layers comprising other components. For instance, as an example of such a light-sensitive lithographic printing plate, mention may be made of positive working light-sensitive lithographic printing plates having light-sensitive layers containing as light-sensitive components o-naphthoquinone azides, as described in U.S. Pat. Nos. 3,061,120, 3,061,430, 3,635,709, etc. Further, light-sensitive lithographic printing plates embodying the principles of the present invention can be obtained using as light-sensitive components, for example, polyvinyl cinnamates as described in U.S. Pat. No. 2,725,372, British Pat. Nos. 843,545 and 966,297, etc., light-sensitive polyesters produced by condensation of bisphenol A and divanillal cyclohexanone, and by condensation of p-phenylene diethoxyacrylate and 1,4-di-$\beta$-hydroxyethoxycyclohexanone, as described in Canadian Pat. No. 696,997, prepolymers of diallylphthalate and the like, and ethylenic unsaturated compounds containing at least two unsaturated double bonds in each molecule and that capable of undergoing a polymerization reaction with the aid of radiation of active rays, as described in U.S. Pat. No. 3,462,267, etc. Light-sensitive layers containing polymers that have groups capable of increasing the compatibility with the above-described light-sensitive component in their side chains (hereafter "polymer B") and that themselves possess insufficient compatibility with the light-sensitive component (hereafter "light-sensitive component A") and further can be dissolved in a solvent (hereafter "solvent C") which are capable of dissolving the light-sensitive component A must be determined. Thus, a solution containing the light-sensitive component A, the polymer B and the solvent C is coated on one of the above-described supports and dried. In the course of drying, as the content of the solvent C in the coated layer is decreased through evaporation, the light-sensitive component A and the polymer B cause a phase separation phenomenon and thereby it becomes possible to make the polymer B exist in a large proportion at the surface of the light-sensitive layer. As circumstances require, the partial distribution of the polymer B to the surface can be promoted by changing the drying condition.

In accordance with embodiments of the present invention, it is possible to allow substances possessing high oleophilic property to exist only at the surface of the light-sensitive layers of light-sensitive lithographic printing plates. Therefore, the surfaces of the image areas of lithographic printing plates produced using these light-sensitive lithographic printing plates can also exhibit high oleophilic property. Consequently, these printing plates produce only a small number of spoilages at the beginning of the printing operation.

Since a substance possessing high oleophilic property is present at the surface of the light-sensitive layer in the light-sensitive lithographic printing plate of the present invention, it is possible to use this substance in a small amount. Accordingly, the storage stability of the light-sensitive layer is not impaired by the existence of this substance having high oleophilic property and further the developability of the light-sensitive layer (the facility in the removal of the non-image area using a developing solution) also is not aggravated by this substance. On the contrary, in conventional cases where substances having high oleophilic property were contained in the light-sensitive layers in homogeneously distributed states, appreciable amounts of these substances had to be used for increasing the oleophilic property to a satisfactory extent. This has been linked to defects of deteriorations in the storage stability and the developability of a light-sensitive lithographic printing plate. According to embodiments of the present invention, the improvement upon the oleophilic property can be achieved without the attended defects inherent in conventional techniques as described above. The light-sensitive lithographic printing plate of the present invention owes such effects as described above entirely to the surface of the light-sensitive layer thereof constituted so as to exhibit higher oleophilic property than portions of the layer located below the surface exhibit.

The present invention will now be illustrated in greater detail by reference to the following examples. Unless otherwise indicated all parts, percents, etc., are by weight.

EXAMPLE 1

A 2S aluminum plate 0.15 mm thick was degreased in a 10% aqueous solution of sodium tertiary phosphate maintained at a temperature of 80° C. for 3 minutes and then subjected to a graining treatment using a nylon brush. Next, it was etched with an aqueous solution of sodium aluminate warmed to 60° C. over a period of about 10 seconds, followed by desmutting using a 3% aqueous solution of sodium hydrogensulfate. The resulting aluminum plate received anodic oxidation in a 20% sulfuric acid by passing electric current having a density of 2 A/dm$^2$ therethrough for 2 minutes and then it was treated with a 2.5% aqueous solution of sodium silicate heated up to 70° C. for 1 minute. Thus, the anodically oxidized aluminum plate (I) was obtained.

On the thus-obtained aluminum plate (I) was coated the following light-sensitive composition (A) or (B). The coated plate was dried at a temperature of 100° C. for 2 minutes.

| Light-Sensitive Composition (A) | |
|---|---|
| 2-Hydroxyethyl Methacrylate Copolymer (prepared according to Example 1 of U.S. Pat. No. 4,123,267) | 0.7 g |
| 2-Methoxy-4-hydroxy-5-benzoylbenzene Sulfonic Acid Salt of the Condensation Product of p-Diazodiphenylamine and Paraformaldehyde | 0.1 g |
| Oil Blue #603 | 0.03 g |
| 2-Methoxyethanol | 6 g |
| Methanol | 6 g |
| Ethylene Dichloride | 6 g |
| Light-Sensitive Composition (B) | |
| Light-Sensitive Composition (A) | 18.83 g |
| Styrene-Maleic Anhydride Copolymer (ratio of styrene to maleic anhydride by mole: 1.5 to 2:1) Half-Esterified with 2-Methyl-4-pentanol (m.w.: about 1,500) (Stylite HS-2, a product of Daido Kogyo Co., Ltd.) | 0.014 g |

A dry coverage of the coated layer was 2.0 g/m$^2$. The thus-obtained light-sensitive lithographic printing plates are referred to as (A) and (B), respectively. Each of the light-sensitive lithographic printing plates (A) and (B) was exposed to light emitted from a 30 A carbon arc lamp placed at 75 cm distance through an image-bearing transparency for 45 seconds and dipped in the following developing solution at room temperature for 1 minute followed by lightly rubbing the surface with absorbent cotton to remove the unexposed areas. Thus, lithographic printing plates (A) and (B) were obtained separately.

| Developing Composition | |
|---|---|
| Sodium Sulfite | 3 g |
| Benzyl Alcohol | 30 g |
| Triethanol Amine | 20 g |
| Monoethanol Amine | 5 g |
| Pelex NBL (sodium t-butylnaphthalene sulfonate, a product of Kao Atlas Co., Ltd.) | 30 g |
| Water | 1,000 ml |

On the occasion that printing was carried out on some sheets of high quality paper using the thus-obtained lithographic printing plates, 10 sheets of copies were printed before lithographic printing plate (A) was able to produce the copy printed with ink having sufficiently high density, while only 3 copies were required before the lithographic printing plate (B) was able to produce the copy printed with ink having sufficiently high density.

In addition, contact angles were measured with respect to the image areas of these lithographic printing plates prior to printing, after the production of 5,000 copies, after the production of 10,000 copies, after the production of 20,000 copies and after the production of 50,000 copies. The results are shown in Table 1.

TABLE 1

| Lithographic Printing Plate | Contact Angle (degree) | | | | |
|---|---|---|---|---|---|
| | Before Printing | 5,000 Sheets | 10,000 Sheets | 20,000 Sheets | 50,000 Sheets |
| (A) | 95 | 95 | 95 | 95 | 95 |
| (B) | 135 | 125 | 110 | 95 | 95 |

Further, each of the light-sensitive lithographic printing plates (A) and (B) prepared in the same manner as described above, respectively, was allowed to stand for one week at a temperature of 45° C. and at a humidity of 75% which condition corresponds to storage for one year under a natural conditions (hereafter "incubation") and then subjected in sequence to imagewise exposure and development-processing as described above. In both cases, no changes in sensitivity were observed and stains were hardly observed on the blanket of a printing machine in the areas corresponding to the non-image areas upon printing.

As can be seen from the above-described results, the light-sensitive lithographic printing plate of the present invention has the image area exhibiting high oleophilic property only in the surface part thereof and provides a lithographic printing plate producing only a small number of spoilages at the beginning of printing operation and further is excellent in storage stability.

EXAMPLE 2

On the same aluminum plate (I) used in Example 1 was coated a light-sensitive composition (C) having the following composition in the same manner as in Example 1. The coated layer was dried under the same condition as Example 1 to prepare the light-sensitive lithographic printing plate (C).

| Light-Sensitive Composition (C) | |
|---|---|
| Light-Sensitive Composition (A) | 18.83 g |
| Styrene-Maleic Anhydride Copolymer (ratio of styrene to maleic anhydride by mole: 1:1) Half Esterified with n-Hexanol (viscosity was 15.4 cp in a 5 wt% solution of ethylene glycol monomethyl ether) | 0.014 g |

For the purpose of comparison, the light-sensitive lithographic printing plate (A) was prepared in the same manner as in Example 1. A dry coverage of the coated layer was 2.0 g/m² in both cases.

These light-sensitive printing plates (A) and (C) were subjected in sequence to imagewise exposure and development-processing in the same manner as in Example 1, separately, and thus, lithographic printing plates (A) and (C) were obtained.

Each of these printing plates (A) and (C) was set in the prescribed portion of an automatic proof press (a product of Orion Kikai), and printing was carried out using Neolex Ink (a product of Dai-Nippon Seiki Kogyo Co., Ltd.). In case of the printing plate (A), the print having sufficient ink density could not be obtained even after 10 copies had been printed. On the contrary, in case of the printing plate (C), as early as the third copy, sufficient ink density was obtained.

In addition, contact angles were measured with respect to the image areas of these lithographic printing plates (A) and (C) in the same manner as in Example 1. The results are shown in Table 2.

TABLE 2

| Lithographic Printing Plate | Contact Angle (degree) | | | | |
|---|---|---|---|---|---|
| | Before Printing | 5,000 Sheets | 10,000 Sheets | 20,000 Sheets | 50,000 Sheets |
| (A) (comparison) | 95 | 95 | 95 | 95 | 95 |
| (C) (invention) | 145 | 130 | 110 | 95 | 95 |

It can be seen from the above results that the image area of the lithographic printing plate prepared from the light-sensitive lithographic printing plate of the present invention exhibits high oleophilic property particularly at the surface thereof.

Further, each of light-sensitive lithographic printing plates (A) and (C) was subjected to the incubation in the same manner as in Example 1. Then, each of them was subjected to, in sequence, imagewise exposure and the development-processing in the same manner as in Example 1. No differences in the sensitivity and in developability were observed between the printing plates (A) and (C). In addition, regarding stains to adhere to the blanket of a printing machine used in the areas corresponding to the non-image area upon printing, no difference between them was observed.

It turned out from these results that the storage stability of the light-sensitive layer contained in the light-sensitive lithographic printing plate of the present invention was not impaired by the styrene-maleic anhydride copolymer half esterified by n-hexanol which was added to the light-sensitive layer in order to improve the oleophilic property.

EXAMPLE 3

On the same aluminum plate (I) as used in Example 1 was coated a light-sensitive composition (D) having the following composition in the same manner as in Example 1 to prepare the light-sensitive lithographic printing plate (D).

| Light-Sensitive Composition (D) | |
|---|---|
| Light-Sensitive Composition (A) | 18.83 g |
| Styrene-Maleic Anhydride Copolymer (ratio of styrene to maleic anhydride by mol: 1:1) Half Esterified with 2-Ethylhexanol (viscosity was 6.8 cp when measured in a 5 wt% solution of ethylene glycol monomethyl ether) | 0.014 g |

For the purpose of comparison, the light-sensitive lithographic printing plate (A) was prepared in the same manner as in Example 1. A dry coverage of the coated layer was 2.0 g/m² in each case.

These light-sensitive printing plates were subjected in sequence to imagewise exposure and a development-processing in the same manner as in Example 1, separately, to result in the production of lithographic printing plates (A) and (D), respectively.

Each of these printing plates was set in the position of a Heidel CTO printing machine and printing was carried out using sheets of high quality paper. Therein, the printing plate (A) required 12 sheets of paper before a print having sufficiently high ink density could be obtained, while the printing plate (D) required only 3 sheets of paper to obtain a print providing sufficient ink density.

In addition, contact angles were measured with respect to the image areas of these lithographic printing plates (A) and (D) in the same manner as in Example 1. The results obtained are shown in Table 3.

TABLE 3

| Lithographic Printing Plate | Contact Angle (degree) | | | | |
|---|---|---|---|---|---|
| | Before Printing | 5,000 Sheets | 10,000 Sheets | 20,000 Sheets | 50,000 Sheets |
| (A) | 95 | 95 | 95 | 95 | 95 |
| (D) | 130 | 115 | 98 | 95 | 95 |

While the invention has been described in detail and with reference to specific embodiments thereof, it will be apparent to one skilled in the art that various changes and modifications can be made therein without departing from the spirit and scope thereof.

What is claimed is:

1. A light-sensitive lithographic printing plate comprising a support having provided on at least one surface thereof a light-sensitive layer comprising a light-sensitive component, a first resin and a second resin having poor compatibility with said first resin, said first resin including side chains which are compatible with said second resin and said first resin selectively accumulating at the outermost surface of said light-sensitive layer to impart higher oleophilicity thereto whereby the outermost surface of said light-sensitive layer exhibits higher oleophilicity than the balance of the light-sensitive layer, wherein said light-sensitive layer comprises:

(a) as said first resin, a copolymer having repeating units of the formulae (I) and (II):

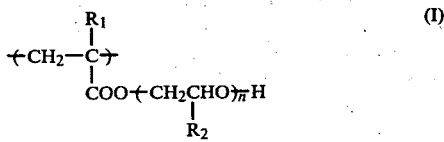

wherein $R_1$ represents a hydrogen atom or a methyl group, $R_2$ represents a hydrogen atom, a methyl group, an ethyl group or a chloromethyl group, and n represents an integer of 1 to 10;

wherein $R_3$ represents a hydrogen atom or a methyl group and having an acid value of about 10 to 100;

(b) as said second resin, a copolymer having repeating units of the formulae (III) and (IV):

wherein $R_4$ represents a hydrogen atom, a methyl group, an ethyl group, a methoxy group, an ethoxy group or an aryl group;

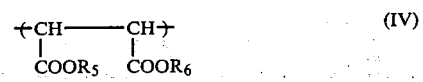

wherein $R_5$ represents a hydrogen atom, a methyl group or an ethyl group, and $R_6$ represents an alkyl group or an aryl group; and (c) a diazo compound, as said light-sensitive component.

2. The printing plate of claim 1, wherein said component (a) comprises about 30 to 80% by weight of the repeating unit represented by the formula (I) and about 5 to 60% by weight of the repeating unit represented by the formula (II).

3. The printing plate of claim 2, wherein said component (a) has a molecular weight of about 5,000 to about 60,000.

4. The printing plate of claim 1, wherein said component (b) comprises 20 to 80% by weight of said repeating unit represented by the formula (III) and 20 to 80% by weight of said repeating unit represented by the formula (IV).

5. The printing plate of claim 4, wherein said component (b) has a molecular weight of about 500 to 50,000.

6. The printing plate of claim 1, wherein said component (a) is present in an amount of about 50 to 95% by weight.

7. The printing plate of claim 1, wherein said component (b) is present in an amount of about 0.05 to 20% by weight.

8. The printing plate of claim 1, wherein said diazo compound is present in an amount of about 5 to 50% by weight.

9. The printing plate of claim 1, wherein said diazo compound contains two or more diazo groups per molecule.

10. The printing plate of claim 9, wherein said diazo compound is a salt of a condensate of p-diazodiphenylamine and formaldehyde or acetaldehyde, a condensate of 2,5-dimethoxy-4-p-tolylmercaptobenzenediazonium and formaldehyde, or the condensate of 2,5-dimethoxy-4-morpholinobenzenediazonium and formaldehyde or acetaldehyde.

11. The printing plate of claim 1, wherein said diazo compound is a diazo resin compatible with said component (a).

12. The printing plate of claim 1, wherein said diazo compound is represented by the formula (VIII):

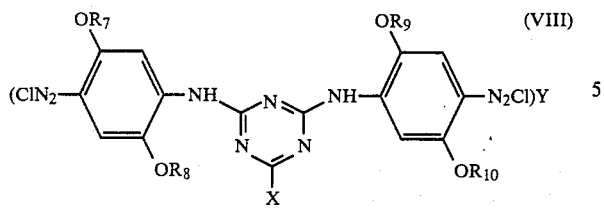

wherein $R_7$, $R_8$, $R_9$ and $R_{10}$ each represents an alkyl group containing 1 to 4 carbon atoms, X represents a substituted amino group, and Y represents an acid anion.

13. The printing plate of claim 1, wherein said light-sensitive layer consists essentially of
(a) a copolymer in which, on weight basis:
(1) from about 30 to 80% of the repeating structural units of said copolymer are represented by the general formula (I)

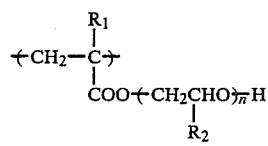

wherein $R_1$ is a hydrogen atom or methyl group, $R_2$ is a hydrogen atom, a methyl, ethyl or chloromethyl group and n is an integer of 1 to 10;
(2) from about 5 to 60% of the repeating structural units of said copolymer are acrylonitrile units or methacrylonitrile units of the general formula (II)

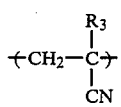

wherein $R_3$ is hydrogen or methyl;
(3) wherein repeating structural units of said copolymer include alpha, beta ethylenically unsaturated carboxylic acid units or half ester units of a cyclic acid anhydride with the repeating structural units of general formula (I), the amount of component (3) being such that said copolymer has an acid value of about 10 to 100; and
(4) wherein from 64 to 0% of the repeating units of said copolymer are addition polymerizable ethylenically unsaturated compound units other than (1), (2), or (3), wherein said ethylenically unsaturated compound units are selected from the group consisting of acrylates, methacrylates, acrylamide, methacrylamide, allyl compounds, vinyl ether, vinyl esters, styrenes or crotonates, the viscosity of said copolymer being 1,000 to 20,000 cps as determined for a 33% by weight solution of said copolymer in ethylene glycol monomethyl ether at 25° C. by a Brookfield rotational viscosimeter;
(b) a copolymer in which, on weight basis:
(1) from about 20% to about 80% of the repeating structural units of said copolymer are represented by general formula (III)

wherein $R_4$ represents a hydrogen atom, a methyl group, an ethyl group, a methoxy group, an ethoxy group or an aryl group;
(2) from about 20% to about 80% of the repeating structural units of said copolymer are represented by general formula (IV)

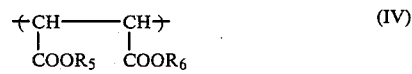

wherein $R_5$ represents a hydrogen atom, a methyl group or an ethyl group, and $R_6$ represents an alkyl group or an aryl group; and
(c) a diazo compound, said copolymer component (a), said copolymer component (c) being present, respectively, in an amount of about 50 to about 95% by weight, about 0.05 to about 20% by weight and about 5 to 50% by weight, based on the total weight of the light-sensitive layer.

14. The printing plate of claim 13, wherein said copolymer component (a), said copolymer component (b) and said diazo compound component (c) are present, respectively, in an amount of 60 to 92% by weight, 0.1 to 5% by weight and 8 to 20% by weight.

15. A light-sensitive composition for use in a light-sensitive lithographic printing plate which comprises a light-sensitive component, a first resin and a second resin having poor compatibility with said first resin, wherein said first resin contains side chains which are compatible with said second resin and said first resin selectively accumulates at the surface of the light-sensitive layer, which is formed by coating and drying the composition on a support, to thereby impart higher oleophilicity thereto, wherein said composition comprises:
(a) as said first, resin, a copolymer having repeating units of the formulae (I) and (II):

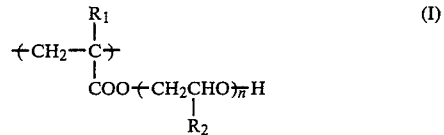

wherein $R_1$ represents a hydrogen atom or a methyl group, $R_2$ represents a hydrogen atom, a methyl group, an ethyl group or a chloromethyl group, and n represents an integer of 1 to 10;

wherein $R_3$ represents a hydrogen atom or a methyl group and having an acid value of about 10 to 100;
(b) as said second resin, a copolymer having repeating units of the formulae (III) and (IV):

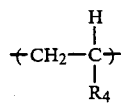

wherein R₄ represents a hydrogen atom, a methyl group, an ethyl group, a methoxy group, an ethoxy group or an aryl group;

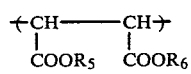

wherein R₅ represents a hydrogen atom, a methyl group or an ethyl group, and R₆ represents an alkyl group or an aryl group; and (c) a diazo compound, as said light-sensitive component.

16. The light-sensitive composition of claim 15, wherein said component (a) comprises about 30 to 80% by weight of the repeating unit represented by the formula (I) and about 5 to 60% by weight of the repeating unit represented by the formula (II).

17. The light-sensitive composition of claim 16, wherein said component (a) has a molecular weight of about 5,000 to about 60,000.

18. The light-sensitive composition of claim 16, wherein said component (b) comprises 20 to 80% by weight of said repeating unit represented by the formula (III) and 20 to 80% by weight of said repeating unit represented by the formula (IV).

19. The light-sensitive composition of claim 18, wherein said component (b) has a molecular weight of about 500 to 50,000.

20. The light-sensitive composition of claim 16, wherein said component (a) is present in an amount of about 50 to 95% by weight.

21. The light-sensitive composition of claim 16, wherein said component (b) is present in an amount of about 0.05 to 20% by weight.

22. The light-sensitive composition of claim 16, wherein said diazo compound is present in an amount of about 5 to 50% by weight.

23. The light-sensitive lithographic printing plate of claim 15, wherein said diazo compound contains two or more diazo groups per molecule thereof.

24. The light-sensitive composition of claim 16, wherein said diazo compound contains two or more diazo groups per molecule.

25. The light-sensitive composition of claim 24, wherein said diazo compound is a salt of a condensate of p-diazodiphenylamine and formaldehyde or acetaldehyde, a condensate of 2,5-dimethoxy-4-p-tolylmercaptobenzenediazonium and formaldehyde, or the condensate of 2,5-dimethoxy-4-morpholinobenzenediazonium and formaldehyde or acetaldehyde.

26. The light-sensitive composition of claim 16, wherein said diazo compound is a diazo resin compatible with said component (a).

27. The light-sensitive composition of claim 16, wherein said diazo compound is represented by the formula (VIII):

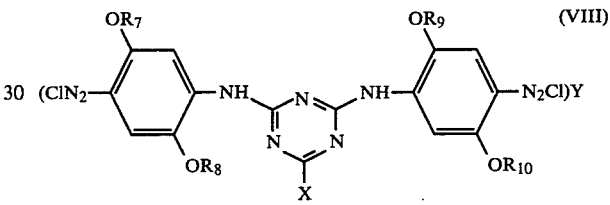

wherein R₇, R₈, R₉ and R₁₀ each represents an alkyl group containing 1 to 4 carbon atoms, X represents a substituted amino group, and Y represents an acid anion.

* * * * *